(12) United States Patent
Yehui et al.

(10) Patent No.: US 7,683,720 B1
(45) Date of Patent: Mar. 23, 2010

(54) FOLDED-CASCODE AMPLIFIER WITH ADJUSTABLE CONTINUOUS TIME EQUALIZER

(75) Inventors: Sun Yehui, Shanghai (CN); Jiang Lixin, Shanghai (CN)

(73) Assignee: Integrated Device Technology, inc., San Jose, CA (US)

( * ) Notice: Subject to any disclaimer, the term of this patent is extended or adjusted under 35 U.S.C. 154(b) by 12 days.

(21) Appl. No.: 11/781,629

(22) Filed: Jul. 23, 2007

Related U.S. Application Data

(60) Provisional application No. 60/942,704, filed on Jun. 8, 2007.

(51) Int. Cl.
 *H03F 3/04* (2006.01)
(52) U.S. Cl. .................. 330/311; 30/304; 30/252
(58) Field of Classification Search ................ 330/311, 330/304, 252
 See application file for complete search history.

(56) References Cited

U.S. PATENT DOCUMENTS

| | | | |
|---|---|---|---|
| 4,151,482 A | 4/1979 | Robe | |
| 5,574,401 A | 11/1996 | Spitalny | |
| 5,589,785 A * | 12/1996 | Garavan | 327/63 |
| 6,762,646 B1 | 7/2004 | Bell | |
| 7,183,817 B2 | 2/2007 | Sanchez et al. | |
| 7,268,588 B2 | 9/2007 | Sanchez et al. | |
| 2002/0041212 A1* | 4/2002 | Bruck et al. | 330/252 |
| 2004/0085137 A1* | 5/2004 | Furst et al. | 330/311 |
| 2005/0195032 A1 | 9/2005 | Wang et al. | |
| 2006/0132191 A1 | 6/2006 | Palmer | |
| 2006/0220741 A1 | 10/2006 | Jones | |

OTHER PUBLICATIONS

Xavier et al. "An 8-Gb/s Capacitively Coupled Receiver With High Common-Mode Rejection for Uncoded Data," IEEE Journal of Solid-State Circuits, vol. 39, No. 11, Nov. 2004.

* cited by examiner

*Primary Examiner*—Michael B Shingleton
(74) *Attorney, Agent, or Firm*—Molly Sauter; Kenneth Glass; Glass & Associates

(57) ABSTRACT

A system and method are provided for a folded cascode amplifier circuit that includes a first order high-pass filter coupled to a first bias voltage, a first input signal and a second input signal, the first input signal and the second input signal defining a differential input signal and the first order high-pass filter arranged to establish a first bias output and a second bias output. To amplify the full-spectrum content of the input signal, the amplifier circuit includes a full-spectrum content amplifier coupled between the first input signal, the second input signal and a current source. To amplify the high-frequency content of the input signal to achieve equalization, the amplifier circuit includes a high-frequency content amplifier coupled to the first bias output and the second bias output, the high-frequency content amplifier arranged to amplify the high-frequency content of the differential input signal to achieve equalization.

18 Claims, 5 Drawing Sheets

FOLDED-CASCODE AMPLIFIER WITH ADJUSTABLE CONTINUOUS TIME EQUALIZER

CROSS-REFERENCE TO RELATED APPLICATION

The present application claims benefit of U.S. Provisional Application Ser. No. 60/942,704, filed Jun. 8, 2007, which is incorporated herein by reference in its entirety.

BACKGROUND OF THE INVENTION

With reference to prior art FIG. 1, an amplifier 10 is often used as the input buffer of the receiver to amplify an incoming differential signal 15. The role of a differential amplifier is to sense changes in its differential input signal while rejecting changes in its common mode, or average, input signal. Removing the common mode component allows the differential amplifier to support relatively large voltage swings and effectively reject noise appearing on both input signals of a differential circuit.

Transmission channels typically exhibit low-pass and other filter effects that distort the transmitted signal, resulting in transmission errors at the receiver. Receiver equalization is known in the art to boost the voltage sensitivity of the receiver to the attenuated frequencies of the transmitted signal, thereby flattening the frequency response of the communication channel.

The prior art teaches employing an amplifier with de-emphasis to achieve equalization by compensating for the low pass characteristics of the transmission channel. The prior art amplifier 10 illustrated in FIG. 1 employs de-emphasis to achieve receiver equalization.

With reference to FIG. 1, ignoring the body effect of the M1 20 and M2 25 transistors of the amplifier 10, the gain of the amplifier can be derived as:

$$H(s) = \frac{V_{out}}{V_{in}} = \frac{g_{m1} R_L}{1 + g_{m1} \frac{R_s}{2(1 + sR_s C_s)}} \quad \text{Equation 1}$$

Where $g_{m1}$ is the transconductance of M1/M2. The impedance of capacitor ($C_s$) 35 decreases with an increase in frequency. As a result, the amplifier gain is higher at higher frequencies than at lower frequencies due to the less equivalent regeneration impedance of $R_s$ 30 and $C_s$ 35. At low frequency, Equation 1 can be re-written as:

$$H(s) \approx \frac{2R_L}{R_s} \quad (\text{If } g_{m1} \cdot R_s \gg 1) \quad \text{Equation 2}$$

For a given power, the maximum gain of the amplifier that can be achieved is $g_{m1} \cdot R_L$ at high frequency and the minimum gain of the amplifier that can be achieved is $$\frac{2R_L}{R_s}$$

at low frequency.

As such, the prior art amplifier 10 de-emphasizes the low frequency content of the signal to achieve equalization at the receiver. As such, some power is wasted due to the de-emphasis of the signal.

In light of the above, a need exists in the art for an improved amplifier that is power efficient in achieving equalization.

SUMMARY OF THE INVENTION

As such, the present invention provides a folded cascode amplifier circuit that includes a first order high-pass filter coupled to a first bias voltage, a first input signal and a second input signal, the first input signal and the second input signal defining a differential input signal and the first order high-pass filter arranged to establish a first bias output and a second bias output. To amplify the full-spectrum content of the input signal, the amplifier circuit includes a full-spectrum content amplifier coupled between the first input signal, the second input signal and a current source. To amplify the high-frequency content of the input signal to achieve equalization, the amplifier circuit includes a high-frequency content amplifier coupled to the first bias output and the second bias output, the high-frequency content amplifier arranged to amplify the high-frequency content of the differential input signal to achieve equalization. Additionally, the amplifier circuit includes a summing circuit coupled to the full-spectrum content amplifier and the high-frequency content amplifier to sum the amplified signals and an output conversion circuit coupled to the summing circuit to output the amplified differential signal.

In a specific embodiment, the first order high-pass filter further includes a switched resistor array coupled to the first bias voltage. The switched resistor array is arranged to set an adjustable −3 dB bandwidth for the high-frequency content amplifier. The high-pass filter further includes a first capacitor coupled between the switched resistor array and the first input signal and a second capacitor coupled between the switched resistor array and the second input signal.

In a particular embodiment, the switched resistor array includes a plurality of fixed value resistors positioned in parallel, each one of the plurality of fixed value resistors being selectable by each one of a plurality of switches and the total number of fixed value resistors selected determining the total resistance value of the switched resistor array. Additionally, the switched resistor array may be digitally controlled by a transistor.

In a particular embodiment, the full-spectrum content amplifier includes a first output node and a second output node, and further includes a differential transistor pair circuit arranged to steer a tail current supplied by the current source between the first output node of the full-spectrum content amplifier and the second output node of the full-spectrum content amplifier in response to the differential input signal. In addition, the differential pair circuit further includes a first transistor arranged to steer the tail current to the first output node of the full-spectrum content amplifier in response to the differential input signal and a second transistor arranged to steer the tail current to the second output node of the full-spectrum content amplifier in response to the differential input signal. The first output node of the full-spectrum content amplifier is then coupled to the first summing input of the summing circuit and the second output node of the full-spectrum content amplifier is coupled to the second summing input of the summing circuit.

In a particular embodiment, the high-frequency content amplifier further includes a third transistor having a control terminal coupled to the first high-pass output, a first terminal coupled to ground and a second terminal coupled to the first summing input of the summing circuit and a fourth transistor having a control terminal coupled to the second high-pass filter output, a first terminal coupled to ground and a second terminal coupled to the second summing input of the summing circuit.

The summing circuit in accordance with a particular embodiment includes a fifth transistor having a first terminal coupled to the first summing input of the summing circuit and to the first output node of the full-spectrum content amplifier and a second terminal coupled to the output conversion circuit and a sixth transistor having a first terminal coupled to the second summing input of the summing circuit and to the second output node of the full-spectrum content amplifier, a second terminal coupled to the output conversion circuit and a control terminal coupled to a control terminal of the fifth transistor.

The output conversion circuit in accordance with an embodiment of the invention includes a first resistor coupled between a supply voltage and a first summing output of the summing circuit and a second resistor coupled between the supply voltage and a second summing output of the summing circuit, the first resistor and the second resistor to convert an output current from the summing circuit into an output voltage.

In accordance with the present invention, a method for achieving equalization in a folded cascode amplifier is provided. In a particular embodiment, the method includes the steps of receiving a first input signal and a second input signal defining a differential input signal, applying a tail current source to establish a tail bias current, amplifying the differential input signal using a first transistor circuit biased by the tail bias current, extracting the high-frequency component of the differential input signal using a high-pass filter comprising a switched resistor array, a first bias voltage and two parallel capacitors, amplifying the high-frequency component using a second transistor circuit biased by the first bias voltage, summing the amplified high-frequency component of the input signal and the amplified differential input signal resulting in a summed output current to achieve equalization of the input signal and converting the summed output current to an output voltage.

In a particular embodiment, the method in accordance with the present invention further includes selecting an equalization coefficient, wherein the equalization coefficient is dependent upon the ratio of the transconductance of the first transistor circuit to the transconductance of the second transistor circuit and the RC time constant of the high-pass filter.

In a particular embodiment, wherein the first transistor circuit comprises a first transistor and a second transistor, the transconductance of the first transistor circuit is dependent upon the size of the first transistor and the size of the second transistor and the tail bias current.

In an additional embodiment, wherein the second transistor circuit comprises a third transistor and a fourth transistor, the transconductance of the second transistor circuit is dependent upon the size of the third transistor and the size of the fourth transistor and the first bias voltage. As such, the transconductance of the high-frequency amplifier is adjustable by adjusting the first bias voltage, whereby increasing the first bias voltage increases the amplification of the high-frequency component.

In accordance with the present invention, an optimized gain of the high-pass filter circuit can be achieved by adjusting the size of the transistors comprising the second transistor circuit and the transconductance of said transistors.

In an additional embodiment, a folded cascode amplifier circuit having adjustable continuous time equalization is provided, the amplifier circuit further comprising, a first amplification circuit for receiving a differential input signal and a tail current bias source, the first circuit being arranged to amplify the differential input signal, wherein the gain of the amplification is in part determined by the tail current bias source, a second amplification circuit for receiving the differential input signal and a first bias voltage, the second circuit being arranged to extract a high-frequency component of the input signal and the amplify the high-frequency component of the input signal, wherein the second amplification circuit further comprises a switched resistor array arranged to receive the differential input signal and the first bias voltage that is independent of the common-mode voltage of the input signal, the gain of the amplification of the second amplification circuit is in part determined by the first bias current. The circuit further comprises a summing circuit to sum the amplified differential input signal from the first circuit and the amplified high-frequency component of the second circuit. In accordance with this embodiment, the switched resistor array is arranged to adjust the gain of the second circuit.

In an additional embodiment, a folded cascode amplifier circuit of the present invention further comprises a level shift function providing, in a first embodiment, a low common mode voltage (as low as to the ground level) and an output level shifted close to VDD for implementing a folded-cascode architecture and vice versa.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
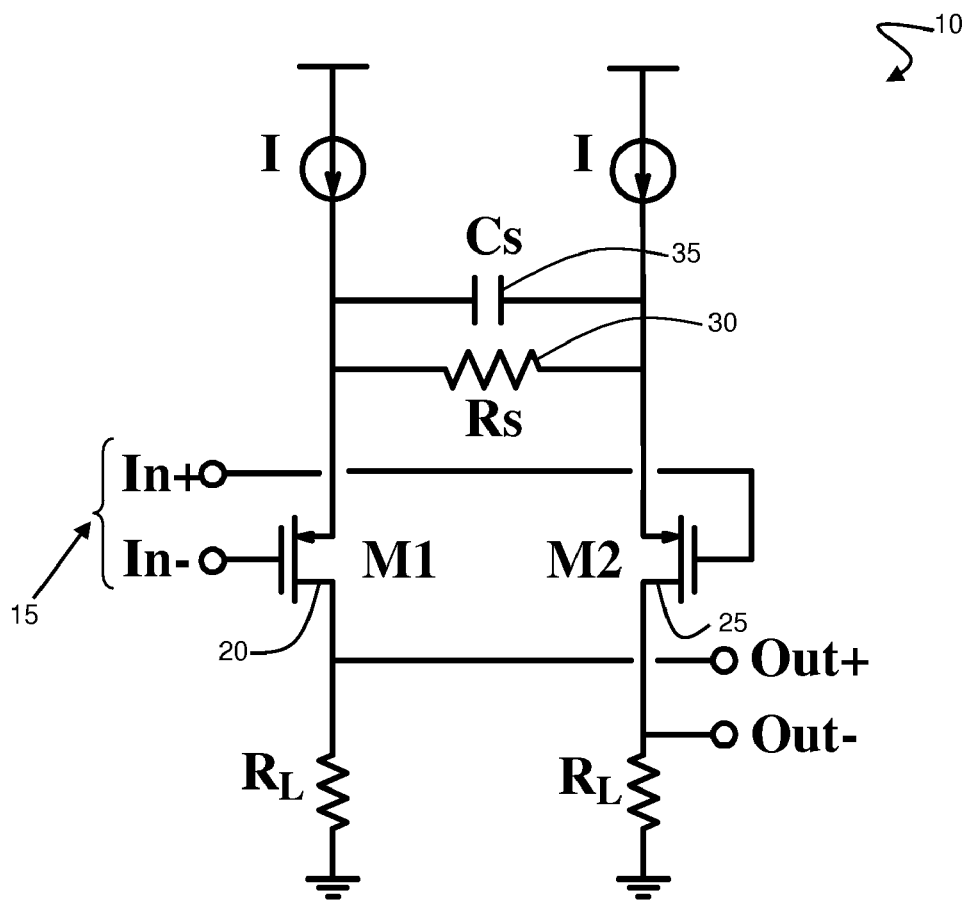
FIG. 1 is a schematic illustration of a prior art amplifier circuit design.
Figure 2:
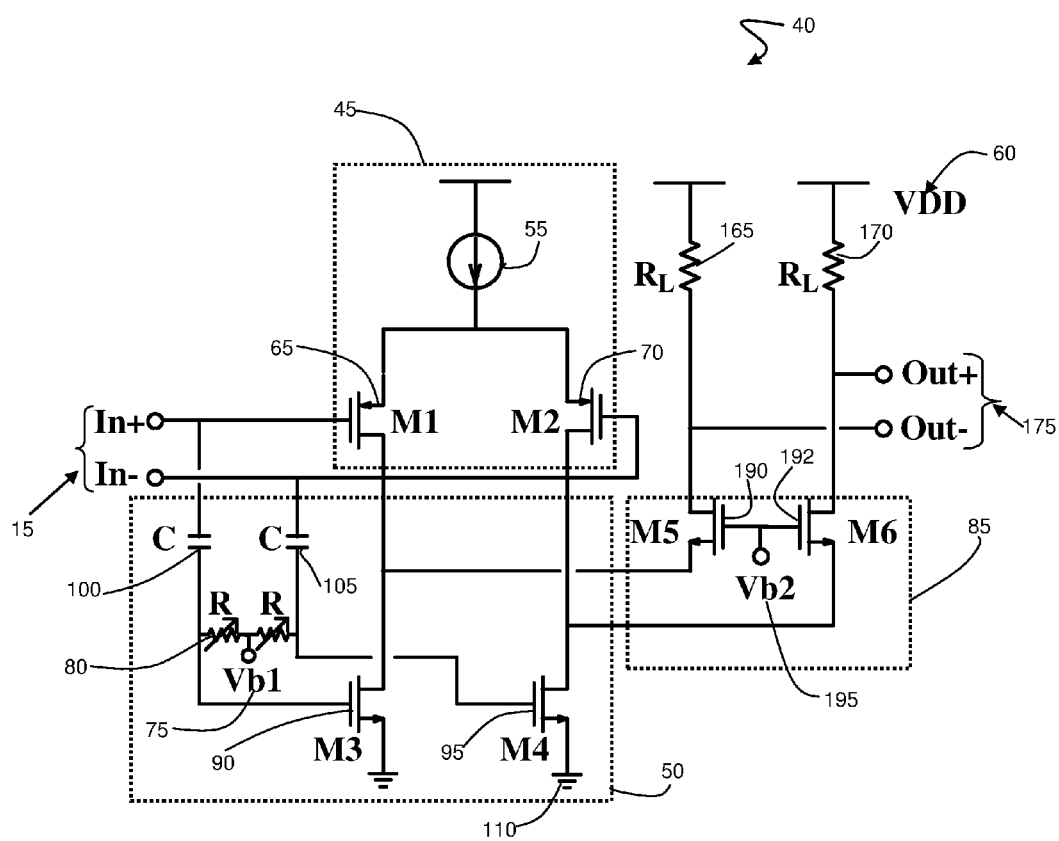
FIG. 2 is a schematic illustration of the present invention in accordance with a particular embodiment.

With reference to FIG. 2, a schematic illustrating a folded-cascode amplifier having adjustable continuous time equalization 40 in accordance with an embodiment of the present invention is provided. Folded-cascode topologies are known in the art to facilitate a high gain with increased stability. The amplifier 40 includes a first amplification circuit 45 for receiving a differential input signal 15 and a tail current bias source 55 from a supply voltage 60, the first amplification circuit 45 is arranged to amplify the differential input signal 15, wherein the gain of the first amplification circuit 15 is in part determined by the tail current bias source 55. As such, the bias current for transistor M1 65 and M2 70 of the first amplification circuit 45 is set by the tail source current 55.

Again with reference to FIG. 2, the amplifier 40 in accordance with the present invention further includes a second amplification circuit 50 for receiving the differential input signal 15 and a first bias voltage 75. The second amplification circuit 50 is arranged to extract the high-frequency component of the input signal from the differential input signal 15 and to amplify the high-frequency component of the input signal. In a particular embodiment, the second amplification circuit further includes a switched resistor array 80 arranged to receive the differential input signal 15 and the first bias voltage 75 and to output a first bias current that is independent of the common-mode voltage of the input signal 15. As such, the gain of the second amplification circuit 50 is in part determined by the first bias current generated by the first bias voltage 75.

As shown in FIG. 2, the output of the first amplification circuit 45 and the second amplification circuit 50 are then summed by a summing circuit 85 to provide the equalized output signal.

In the prior art, circuitry is employed to de-emphasize the low frequency content of the input signal to achieve equalization. This process of de-emphasis results is wasted power. In contrast, the present invention amplifies the high-frequency content of the input signal at the receiver thereby achieving equalization without wasting power.

Additionally, the present invention provides an additional dimension for adjusting the gain of the amplifier. In a classical folded-cascode amplifier, the bias voltage 75 would be directly connected to the gates of transistors M3 90 and M4 95. In accordance with the present invention, the bias voltage 75 is independent from the common-mode voltage of the input signal (In+/In−) 15.

The equalization coefficient of the amplifier depends upon the ratio of the transconductance of transistors M3 90 and M4 95 to the transconductance of transistors M1 65 and M2 70 and the RC time constant established by the resistor array 80 and the parallel capacitors 100,105. Additionally, transconductance of a transistor depends upon its size (W/L, channel width/channel length) and its bias current. In accordance with the present invention, the bias current of M3/M4 and M1/M2 can be set independently of each other. The bias current for M1/M2 is set by the tail current source input 55, and the bias current for M3/M4 is set by Vb1 75.

As such, the present invention provides for three dimensions to tune the equalization coefficient: (1) ratio of transistor sizes W/L, (2) ratio of bias currents and (3) RC time constant. This additional dimension of tenability will benefit the amplifier in allowing a more optimum design. For example, if a high equalization coefficient is desired, the prior art approach would require an increase in W/L sizes of transistors M3/M4, which would take additional area and introduce more parasitics. By contrast, with the system and method of the present invention, the bias voltage Vb1 75 can be changed to increase the bias current for M3/M4 to achieve a high equalization coefficient without increasing the sizes of the transistors.

Additionally, because the present invention is based on a folded-cascode amplifier architecture, the present invention provides a level shift function wherein the input common mode voltage is low (as low as to ground) and the output level is shifted close to VDD 60. Alternatively, the input common mode voltage may be high and the output level shifted close to ground.

Figure 3:
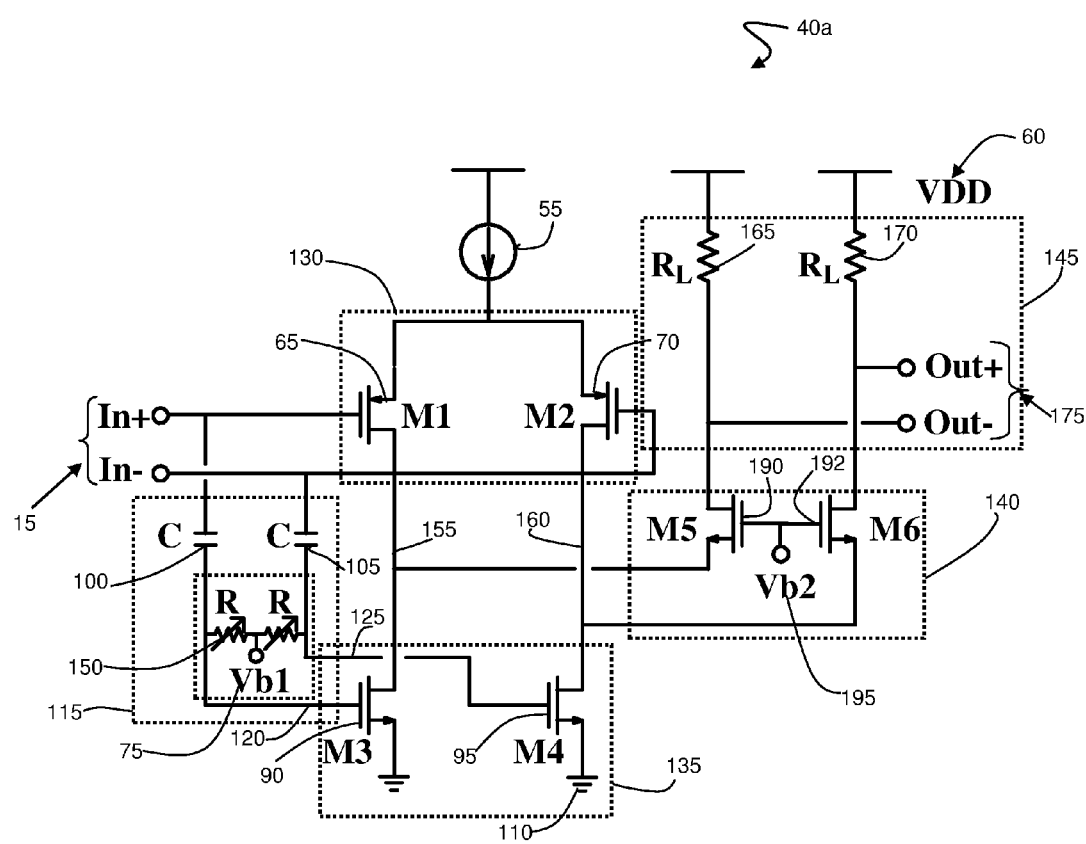
FIG. 3 is a schematic illustration of the present invention in accordance with a particular embodiment.

The present invention uses a new architecture to emphasize the high-frequency content of a signal to achieve equalization. With reference to FIG. 3, a folded cascode amplifier circuit in accordance with the present invention 40a comprises, a first order high-pass filter 115 coupled to a first bias voltage 75, a first input signal and a second input signal defining a differential input signal 15.

The amplifier circuit 40a further includes a full-spectrum content amplifier 130 coupled between the differential input signal 15 and a current source 55.

The amplifier circuit 40a further includes a high-frequency content amplifier 135 coupled to the first bias output 120 and the second bias output 125. The high-frequency content amplifier 135 is arranged to amplify the high-frequency content of the differential input signal to achieve equalization.

The amplifier circuit 40a further includes a summing circuit 140 coupled to the full-spectrum content amplifier 130 and the high-frequency content amplifier 135 to sum the outputs from the two amplifiers. In a specific embodiment, the summing circuit 140 further comprises a fifth transistor 190 and a sixth transistor 192 having each of their control terminals coupled to a second bias voltage Vb2 195.

The amplifier circuit 40a further includes an output conversion circuit 145 coupled to the summing circuit to generated the amplified, equalized output signal.

In a particular embodiment, the high-pass filter 115 includes a switched resistor array 150 coupled to a first bias voltage Vb1 75. The switched resistor array 150 is arranged to set an adjustable −3 dB bandwidth for the high-frequency content amplifier 135. The high-pass filter 115 further includes a first capacitor 100 and a second capacitor 105.

Figure 4:
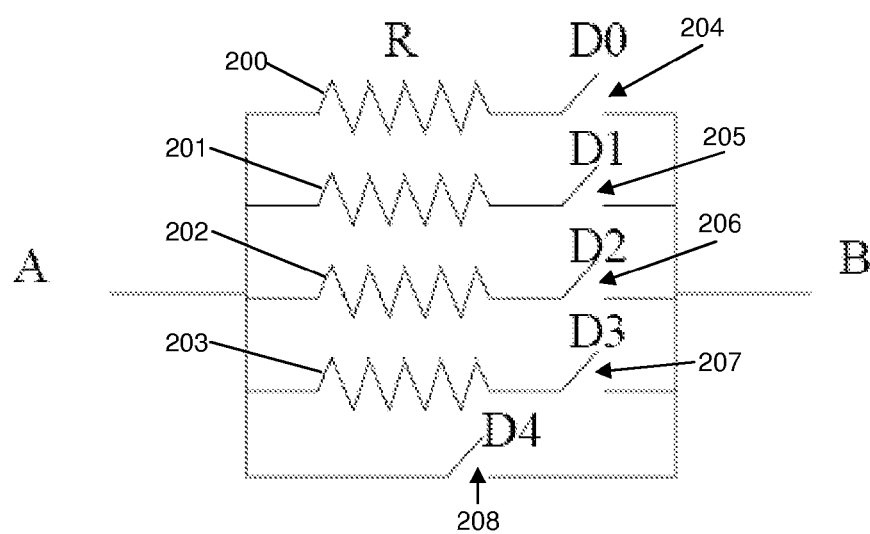
FIG. 4 is a schematic illustration of the switched resistor array in accordance with an embodiment of the present invention.

As show with reference to FIG. 4, in a particular embodiment, the switched resistor array 150 comprises a plurality of fixed value resistors 200-203 that are selectable by each of one of a plurality of switches 204-208 and the total number of fixed value resistors selected determines the total resistance value of the switched resistor array.

With reference again to FIG. 3, in a particular embodiment, the full-spectrum content amplifier 130 comprises a differential transistor pair circuit including a first transistor 65 and a second transistor 70 arranged to steer the tail current supplied by the current source 55 between a first output node 155 and a second output node 160. In addition, the high-frequency content amplifier 135 further comprises a third transistor 90 and a fourth transistor 95 arranged to provide an amplified output of the high-frequency content amplifier 135. Additionally, the summing circuit 140 takes the outputs from the full-spectrum content amplifier 130 and the high-frequency content amplifier 135 and sums them to provide an output 175 from the output conversion circuit 145 across the load resistors $R_L$ 165,170.

In accordance with the operation of the present invention, transistors M3 90 and M4 95 are cascode transistors that are biased by the first bias voltage Vb1 75. A differential voltage from the input signal 15 is applied across transistors pairs M1 65 and M2 70 and cascode transistors M3 90 and M4 95 which each have a terminal coupled to a ground node 110.

Transistors M1 65 and M2 70 cooperate with current source 55 to operate as a differential pair circuit that steers current to one of two output nodes 155, 160 in response to the differential voltage from the input signal 15.

While the illustrated embodiments of the present invention show particular transistors as being PMOS or NMOS transistors this is not meant to be limiting and the NMOS and PMOS transistors may be substituted for each other without departing from the present invention as described.

Figure 5:
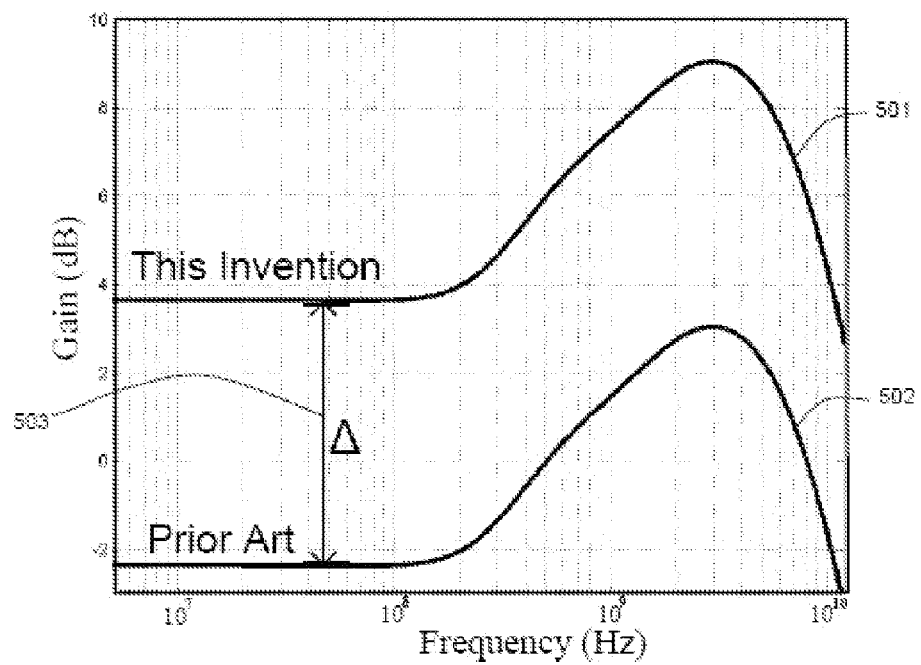
FIG. 5 is a gain curve comparison graph between the present invention and the prior art.

As shown with reference to FIG. 5, the frequency response of the proposed amplifier in accordance with the present invention as compared to the prior art for the same power consumption. As shown with reference to FIG. 5, curve 501 illustrates the frequency response of the present invention as compared curve 502 which illustrates the frequency response for a typical prior art amplifier. As shown by arrow 503, the method and apparatus of the present invention provides an increased gain as compared to the prior art amplifier for the same power consumption.

As such, the present invention provides for an amplifier architecture and method of use that is more power efficient than the prior art designs. The present invention boots the high frequency gain to achieve equalization. In addition, to achieve an optimized gain of the high pass filter, the present invention provides for tuning of the size and the bias current of the cascode transistors M3 and M4.

Although specific embodiments of the invention have been disclosed, it will be understood by those having ordinary skill in the art that changes can be made to the specific embodiments without departing from the spirit and scope of the invention. Additionally, many modifications may be made to adapt a particular situation to the teachings of the present invention without departing from the central inventive concepts described herein. Furthermore, an embodiment of the present invention may not include all of the features described above. The scope of the invention is not to be restricted, therefore, to the specific embodiments, and it is intended that the appended claims cover any and all such applications, modifications, and embodiments within the scope of the present invention.

What is claimed is:

1. A folded cascode amplifier circuit comprising:
  a first order high-pass filter coupled to a first bias voltage, a first input signal and a second input signal, the first input signal and the second input signal defining a differential input signal and the first order high-pass filter arranged to establish a first bias output and a second bias output;
  a full-spectrum content amplifier coupled between the first input signal, the second input signal and a current source, the full-spectrum content amplifier arranged to amplify the differential input signal and to output an amplified differential input signal;
  a high-frequency content amplifier comprising a first transistor having a control terminal coupled to the first bias output of the first order high-pass filter, a first terminal coupled to ground and a second terminal coupled to the output of the full-spectrum content amplifier and a second transistor having a control terminal coupled to the second bias output of the first order high-pass filter, a first terminal coupled to ground and a second terminal coupled to the output of the first order high-pass filter, the high-frequency content amplifier arranged to amplify the high-frequency content of the differential input signal and to output an amplified high-frequency component of the differential input signal;
  a summing circuit comprising a first transistor having a first terminal coupled to the second terminal of the first transistor of the high-frequency content amplifier and a second transistor having a first terminal coupled to the second terminal of the second transistor of the high-frequency content amplifier and a control terminal coupled to a control terminal of the first transistor of the summing circuit, the summing circuit to receive the amplified differential input signal from the full-spectrum content amplifier and to receive the amplified high-frequency component of the differential input signal from the high-frequency content amplifier, the summing circuit to output a summed output current to achieve equalization of the differential input signal; and
  an output conversion circuit comprising a first input coupled to a second terminal of the first transistor of the summing circuit and a second input coupled to a second terminal of the second transistor of the summing circuit, the output conversion circuit to convert the summed output current from the summing circuit to an output voltage.

2. The circuit of claim 1, wherein the first order high-pass filter further comprises:
  a switched resistor array coupled to the first bias voltage, the switched resistor array arranged to set an adjustable −3 dB bandwidth for the high-frequency content amplifier;
  a first capacitor coupled between the switched resistor array and the first input signal; and
  a second capacitor coupled between the switched resistor array and the second input signal.

3. The circuit of claim 2, wherein the switched resistor array further comprises a plurality of fixed value resistors positioned in parallel, each one of the plurality of fixed value resistors being selectable by each one of a plurality of switches and the total number of fixed value resistors selected determining the total resistance value of the switched resistor array.

4. The switched resistor array of claim 3, wherein each switch in the plurality of switches comprises a digitally controlled transistor.

5. The circuit of claim 1, wherein the full-spectrum content amplifier comprises a first output node and a second output node, the full-spectrum content amplifier further comprising:
  a differential transistor pair circuit arranged to steer a tail current supplied by the current source between the first output node of the full-spectrum content amplifier and the second output node of the full-spectrum content amplifier in response to the differential input signal.

6. The circuit of claim 5, wherein the differential transistor pair circuit further comprises:
  a first transistor arranged to steer the tail current to the first output node of the full-spectrum content amplifier in response to the differential input signal; and
  a second transistor arranged to steer the tail current to the second output node of the full-spectrum content amplifier in response to the differential input signal.

7. The circuit of claim 6, wherein the first output node of the full-spectrum content amplifier is coupled to a first summing input of the summing circuit and the second output node of the full-spectrum content amplifier is coupled to a second summing input of the summing circuit.

8. The circuit of claim 1, wherein the output conversion circuit further comprises:
  a first resistor coupled between a supply voltage and a first summing output of the summing circuit; and a second resistor coupled between the supply voltage and a second summing output of the summing circuit, the first resistor and the second resistor to convert an output current from the summing circuit into an output voltage.

9. A method for achieving equalization in a folded cascode amplifier, the method comprising the steps of:

receiving a first input signal and a second input signal defining a differential input signal;

applying a tail current source to establish a tail bias current;

amplifying the differential input signal using a first transistor circuit biased by the tail bias current;

extracting the high-frequency component of the differential input signal using a high-pass filter comprising a switched resistor array, a first bias voltage and two parallel capacitors;

generating an adjustable −3 db bandwidth with the switched resistor array and the first bias voltage;

amplifying the high-frequency component using a second transistor circuit biased by the first bias voltage;

summing the amplified high-frequency component of the input signal and the amplified differential input signal resulting in a summed output current to achieve equalization of the input signal; and converting the summed output current to an output voltage.

10. The method of claim 9, further comprising the step of selecting an equalization coefficient, wherein the equalization coefficient is dependent upon the ratio of the transconductance of the first transistor circuit to the transconductance of the second transistor circuit and the RC time constant of the high-pass filter.

11. The method of claim 10, wherein the first transistor circuit comprises a first transistor and a second transistor and the transconductance of the first transistor circuit is dependent upon the size of the first transistor and the size of the second transistor and the tail bias current.

12. The method of claim 10, wherein the second transistor circuit comprises a third transistor and a fourth transistor and the transconductance of the second transistor circuit is dependent upon the size of the third transistor and the size of the fourth transistor and the first bias voltage.

13. The method of claim 12, wherein an optimized gain of the high-pass filter circuit can be achieved by adjusting the size of the transistors comprising the second transistor circuit and the first bias voltage.

14. A folded cascode amplifier circuit having adjustable continuous time equalization, the circuit comprising:

a first amplification circuit for receiving a differential input signal and a tail current bias source, the first amplification circuit being arranged to amplify the differential input signal, wherein the gain of the first amplification circuit is in part determined by the tail current bias source;

a second amplification circuit for receiving the differential input signal and a first bias voltage, the second amplification circuit being arranged to extract a high-frequency component of the input signal and to amplify the high-frequency component of the input signal, wherein the second amplification circuit further comprises a switched resistor array arranged to receive the differential input signal and the first bias voltage, the gain of the second amplification circuit is in part determined by the first bias voltage; and a summing circuit to sum the amplified differential input signal from the first amplification circuit and the amplified high-frequency component of the second amplification circuit.

15. The circuit of claim 14, wherein the switched resistor array is arranged to set an adjustable −3 dB bandwidth of the second amplification circuit.

16. The circuit of claim 14, wherein the first amplification circuit further comprises a first transistor and a second transistor and the gain of the amplification is in part determined by the size of the first transistor and the second transistor.

17. The circuit of claim 14, wherein the second amplification circuit further comprises a third transistor and a fourth transistor and the gain of the amplification is in part determined by the size of the third transistor and the fourth transistor.

18. The circuit of claim 16, wherein the first amplification circuit and the second amplification circuit are arranged to receive the differential input signal and to provide a level shift function of an output signal.

* * * * *